United States Patent [19]
Feldman et al.

[11] Patent Number: 4,742,234
[45] Date of Patent: May 3, 1988

[54] CHARGED-PARTICLE-BEAM LITHOGRAPHY

[75] Inventors: Martin Feldman, Berkeley Heights; Martin P. Lepselter, Summit, both of N.J.

[73] Assignee: American Telephone and Telegraph Company, AT&T Bell Laboratories, Murray Hill, N.J.

[21] Appl. No.: 54,146

[22] Filed: May 12, 1987

Related U.S. Application Data

[63] Continuation of Ser. No. 781,403, Sep. 27, 1985, abandoned.

[51] Int. Cl.[4] .............................................. H01J 37/26
[52] U.S. Cl. .................................. 250/492.2; 250/398
[58] Field of Search ........... 250/396 R, 396 ML, 398, 250/492.2, 492.21; 313/361.1

[56] References Cited

U.S. PATENT DOCUMENTS

| | | | |
|---|---|---|---|
| 3,795,833 | 3/1974 | King | 250/396 R |
| 3,895,234 | 7/1915 | O'Keefe et al. | 250/492.2 |
| 4,097,745 | 6/1978 | Parks | 250/396 R |
| 4,130,761 | 12/1978 | Matsuda | 250/398 |
| 4,153,843 | 5/1979 | Pease | 250/492.2 |
| 4,200,794 | 4/1980 | Newberry et al. | 250/396 ML |
| 4,224,523 | 9/1980 | Cream | 250/396 R |
| 4,325,084 | 4/1982 | Van Gorkom et al. | 250/492.2 |
| 4,366,383 | 12/1982 | Sano et al. | 250/398 |
| 4,393,312 | 7/1983 | Collier et al. | 250/492.2 |
| 4,439,684 | 3/1984 | Hemmerich et al. | 250/396 R |
| 4,465,934 | 8/1984 | Westerberg et al. | 250/398 |
| 4,492,873 | 1/1985 | Dmitrieu | 250/396 ML |
| 4,498,952 | 2/1985 | Christensen | 250/396 R |

FOREIGN PATENT DOCUMENTS 50-91274 7/1975 Japan.

OTHER PUBLICATIONS

*IEEE Transactions on Electron Devices*, vol. ED-28, No. 11, Nov. 1981, "A Multiple-Electron-Beam Exposure System for High-Throughput, Direct-Write Submicrometer Lithography", by I. Brodie et al., pp. 1422-1428.

*Primary Examiner*—Bruce C. Anderson
*Attorney, Agent, or Firm*—Lucian C. Canepa

[57] ABSTRACT

An elongated source of charged particles is utilized in a lithographic system to form multiple focused electron (or ion) beams arranged in a linear array. The basis for an extremely high-throughput lithographic system especially suited for direct writing applications is thereby provided.

23 Claims, 5 Drawing Sheets

CHARGED-PARTICLE-BEAM LITHOGRAPHY

This application is a continuation of application Ser. No. 781,403, filed Sept. 27, 1985, now abandoned.

BACKGROUND OF THE INVENTION

This invention relates to the fabrication of microminiature devices and, more particularly, to a charged-particle-beam lithographic method and apparatus adapted to directly write on a workpiece surface in a high-speed manner.

Various types of charged-particle-beam lithographic apparatus are known in the art. Such apparatus utilizing, for example, a single scanned electron beam has been widely used in the electronics industry as a practical tool for generating high-quality fine-featured integrated circuit masks.

Charged-particle-beam lithographic apparatus is also capable of exposing patterns directly on the surface of a workpiece such as a resist-coated semiconductor wafer. But, in practice, such direct-writing apparatus has not been widely accepted for commercial production because of the relatively long time required to write patterns on a large-area wafer.

Efforts have been directed at trying to devise ways of increasing the pattern-writing speed of charged-particle-beam lithographic apparatus. The primary motivation for these efforts is the desire to increase the throughput of the apparatus. In that way, the cost per unit area exposed by the scanning beam would be reduced and the economic attractiveness of the apparatus as a production-worthy lithographic tool would be enhanced.

A number of techniques have been suggested for increasing the writing speed of charged-particle-beam lithographic apparatus. Thus, for example, as described in U.S. Pat. No. 4,393,312 issued to R. J. Collier and M. G. R. Thomson, the pattern-writing speed of such apparatus is increased by utilizing a mode of raster scanning in which the dimensions of a single writing spot are varied in a high-speed way during the scanning process. Other suggested ways of increasing writing speed involve expanding the output of a small-area source of charged particles by means of a linear or two-dimensional lens array to provide multiple writing spots, as described, for example, in U.S. Pat. No. 4,153,843 issued to R. F. W. Pease, and in "A Multiple-Electron-Beam Exposure System for High-Throughput, Direct-Write Submicrometer Lithography," By I. Brodie et al, *IEEE Transactions on Electron Devices,* Vol. ED-28, No. 11, November 1981, pages 1422–1428.

But none of the techniques suggested to date has in practice sufficiently increased writing speed to make charged-particle-beam lithographic apparatus economically attractive for general-purpose production use when operated in its direct-writing mode. Hence, efforts have continued by skilled workers in the art directed at trying to devise substantially faster ways of operating such apparatus. It was recognized that such efforts, if successful, had the potential for making the apparatus suitable for direct-writing production purposes. In turn, the availability and use of high-throughput apparatus characterized by very high resolution and excellent depth-of-focus properties would make it feasible to fabricate extremely high-quality fine-featured integrated circuits in an advantageous low-cost way.

SUMMARY OF THE INVENTION

Accordingly, an object of the present invention is to substantially reduce the writing time required to selectively expose the surface of a workpiece utilizing charged-particle-beam lithography.

Briefly, this and other objects of the present invention are realized in a specific illustrative charged-particle-beam apparatus that is adapted to pattern a resist-coated semiconductor wafer in a high-speed direct-writing mode of operation. An elongated source of charged particles, for example, an electron-emitting hot wire, is utilized in conjunction with an apertured array to form multiple parallel electron beams. Focusing and individual modulation of the beams are carried out in the array. In one embodiment, the array is linear and the width of the array of parallel beams provided thereby is comparable to the width of the wafer to be selectively irradiated. The entire surface of the wafer can thus be exposed in a single pass by sweeping the array of parallel beams across the wafer surface. During the single pass, the array of parallel beams selectively irradiates respective spaced-apart features on the surface. Features of variable length in the direction of the single pass are thereby defined. Irradiation of the surface to define orthogonally disposed features is accomplished, for example, by a magnetic deflection arrangement. An extremely high-throughput lithographic apparatus especially suited for direct-writing applications is thereby provided.

In other particular embodiments of the invention, an elongated p-n junction or multiple individual p-n junctions respectively associated with the apertures in the linear array are utilized as electron sources. In still other embodiments, electron-emitting photosensitive elements constitute the electron sources.

In one advantageous version of the apparatus, a magnetic field is utilized to image electrons from the source onto the linear array. In turn, the same magnetic field serves to project the focused output beams of electrons provided by the linear array onto the wafer surface.

BRIEF DESCRIPTION OF THE DRAWING

A complete understanding of the present invention and of the above and other objects, features and advantages may be gained from a consideration of the following detailed description presented hereinbelow in connection with the accompanying drawing, not drawn to scale, in which.

DETAILED DESCRIPTION

Lithographic apparatus made in accordance with applicants' inventive principles is designed to provide multiple parallel beams of charged particles at the surface of a workpiece such as a resist-coated semiconductor wafer. These charged-particle beams may comprise electrons or ions. Herein, for illustrative purposes, emphasis will be directed to electron beams. But it will be apparent to workers skilled in the art that applicants' inventive principles are also clearly applicable to apparatus in which ions rather than electrons constitute the beams to be selectively scanned over the surface of the workpiece.

Figure 1:
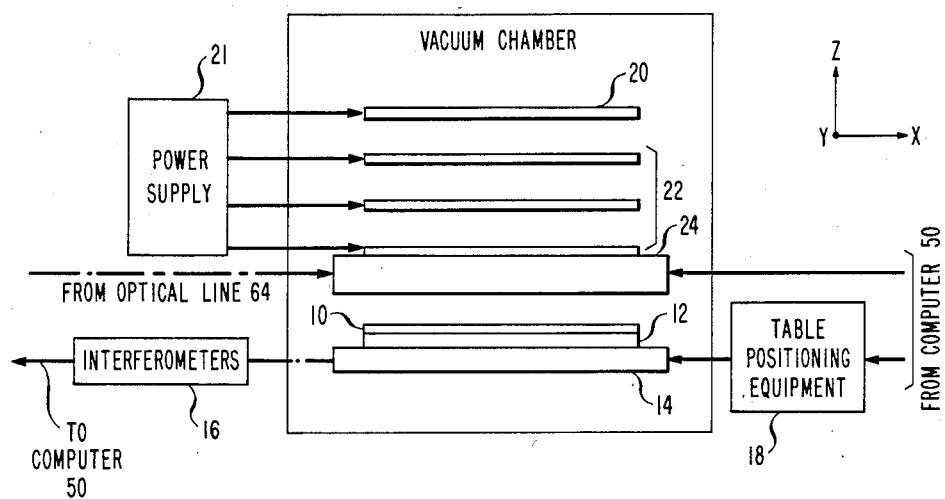
FIG. 1 is a schematic generalized showing of a specific illustrative charged-particle-beam lithographic apparatus made in accordance with the principles of the present invention.

FIG. 1 shows a specific illustrative lithographic apparatus made in accordance with the principles of the present invention for controllably scanning multiple small-size parallel electron beams over the top surface of an electron-resist layer 10 deposited on a wafer 12. In turn, the wafer 12 is mounted on an X-Y-movable table 14.

Conventional interferometers 16 and table-positioning equipment 18 of FIG. 1 are associated with the table 14. The interferometers 16 serve to accurately monitor table position in the X-Y plane and to supply signals indicative thereof to a control computer 50 shown in FIG. 5. The equipment 18 of FIG. 1 is mechanically coupled to the table 14 and responds to signals from the computer 50 by moving the table 14 in a prescribed manner. As will be described in detail later below, the main movement of the table 14 is controlled to occur in the Y direction.

In the illustrative FIG. 1 apparatus, electrons are supplied by an elongated wire element 20. The element 20 is connected to power supply 21 which, for example, causes a constant d-c current to flow through the element to cause it to be heated to a relatively high temperature, for instance, to about 1500 degrees Celsius, at which temperature electrons are emitted. Additionally, the element 20 is connected to a point of reference potential such as ground.

By way of example, the element 20 shown in FIG. 1 comprises a taut wire made of tungsten or of irridium impregnated with a suitable work-function-reducing material. In one specific embodiment, the element 20 comprises a round wire about 50 micrometers ($\mu$m) in diameter coated with thorium.

In accordance with the principles of the present invention, the electron-emitting element 20 (FIG. 1) is relatively long. In one advantageous embodiment, the extent of the element 20 in the X direction is at least equal to the entire X-direction width of the layer 10 to be selectively exposed. In such an embodiment, the entire surface of the layer 10 can be written in a single complete Y-direction excursion or pass of the table 14. Thus, for example, if the resist-coated wafer 12 is 15.24 centimeters (cm) wide in the X direction, the X-direction length of the element 20 is also at least 15.24 cm.

In other embodiments of applicants' invention, the length of the elongated element 20 (FIG. 1) is designed to be less than the entire X-direction width of the wafer 12. In such cases, more than one Y-direction excursion or pass of the table 14 is needed to completely expose the layer 10 utilizing multiple parallel beams. But in every case, whether single-pass or plural-pass operation is selected, the length of the element 20 included in applicants' inventive apparatus is co-extensive with the width of that portion of the wafer that is exposed by multiple beams during each pass.

Electrons emitted by the elongated wire element 20 of FIG. 1 are focused by, for example, an electrostatic lens assembly 22 that comprises three pairs of spaced-apart conductive plates. Downstream of the bottom pair of plates, the focused electrons comprise a beam whose X-direction extent corresponds to the length of the element 20 and whose Y-direction dimension is, for example, approximately 30 $\mu$m. In turn, this long narrow beam impinges on the top of an apertured beam-forming, focusing and blanking assembly 24 which is described in detail below.

Figure 2:
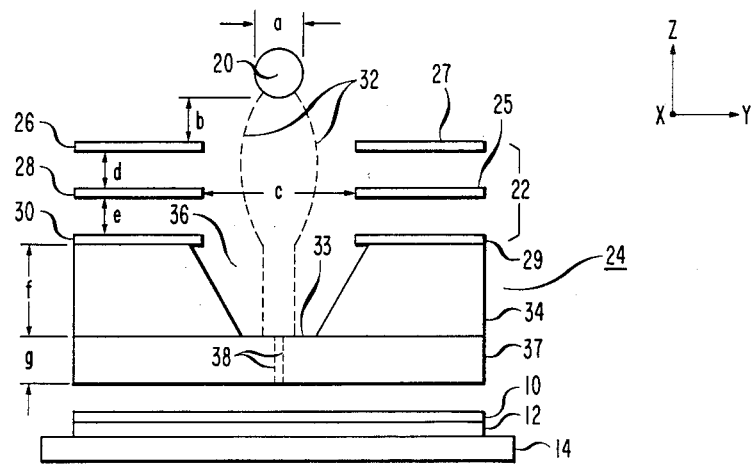
FIG. 2 is a cross-sectional side view of a portion of the apparatus shown in FIG. 1.

The aforementioned electrostatic lens assembly 22 is also depicted in FIG. 2. The assembly 22 comprises a top pair of plates 25 and 26, a middle pair of plates 27 and 28, and a bottom pair of plates 29 and 30. Illustratively, each of the plates 25 and 26 is established at +10 volts with respect to the above-specified point of reference potential to which the element 20 is connected, each of the plates 27 and 28 is at +25 volts, and each of the plates 29 and 30 is at +50 volts. By way of example, the dimensions a, b, c, d, e, f and g indicated in FIG. 2 are approximately 50 $\mu$m, 75 $\mu$m, 125 $\mu$m, 75 $\mu$m, 75 $\mu$m, 500 $\mu$m and 9.6 $\mu$m, respectively. In the illustrative depicted embodiment, the plates 29 and 30 are mounted directly on the uppermost top surface of the assembly 24. The plates 25 through 30 are, for example, each about 75 $\mu$m thick.

The focusing action of the electrostatic lens assembly 22 of FIG. 2 is schematically represented by dash lines 32 which outline the envelope of the resulting electron beam that propagates between the emitting element 20 and the indicated top surface 33 of the beam-forming, focusing and blanking assembly 24. As it impinges upon the indicated top surface of the assembly 24, the electron beam is highly collimated and approximately perpendicular to the top surface of the assembly 24. As previously mentioned, the Y-direction extent of the beam at the point at which it meets the indicated top surface of the assembly 24 is approximately 30 $\mu$m. Illustratively, the current density of the beam at that point is about 1.0 ampere per square centimeter.

The assembly 24 (FIG. 2) comprises a main support member 34 made, for example, of silicon. Illustratively, the member 34 has an elongated X-direction groove 36 formed therein. The length of the groove 36 corresponds approximately to the X-direction extent of the element 20. A multiply apertured subassembly 37 is formed on the bottom surface of the member 34. One such aperture is represented in FIG. 2 by dash lines 38.

Figure 3:
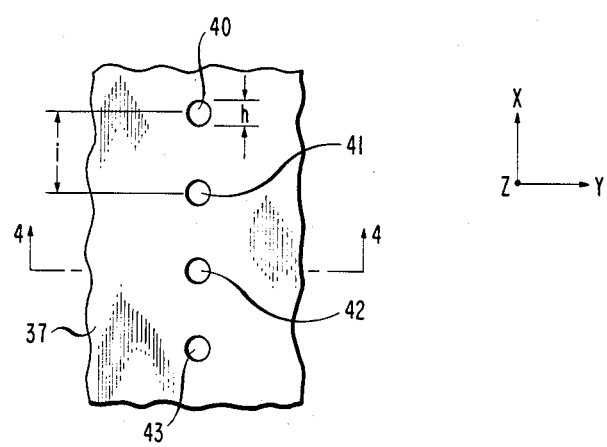
FIG. 3 is a top view of a portion of the apertured array depicted in FIG. 2.

A top view of a portion of the subassembly 37, as viewed from the emitting element 20, is shown in FIG. 3. Four equally spaced-apart apertures 40 through 43 are indicated in the depicted portion. In one particular illustrative embodiment, the apertures are cylindrical and each has a diameter h of about 1 $\mu$m. The center-to-center distance i between adjacent apertures is approximately 4 $\mu$m. Since, as noted above, the Y-direction extent of the electron beam on the surface 33 is about 30 $\mu$m, only a relatively uniform and well-collimated central part of the incident beam actually enters the apertures included in the subassembly 37. Importantly, each individual aperture has in effect associated therewith a respective portion of the element 20, the length of each such portion being approximately equal to the diameter of its associated aperture.

Figure 4:
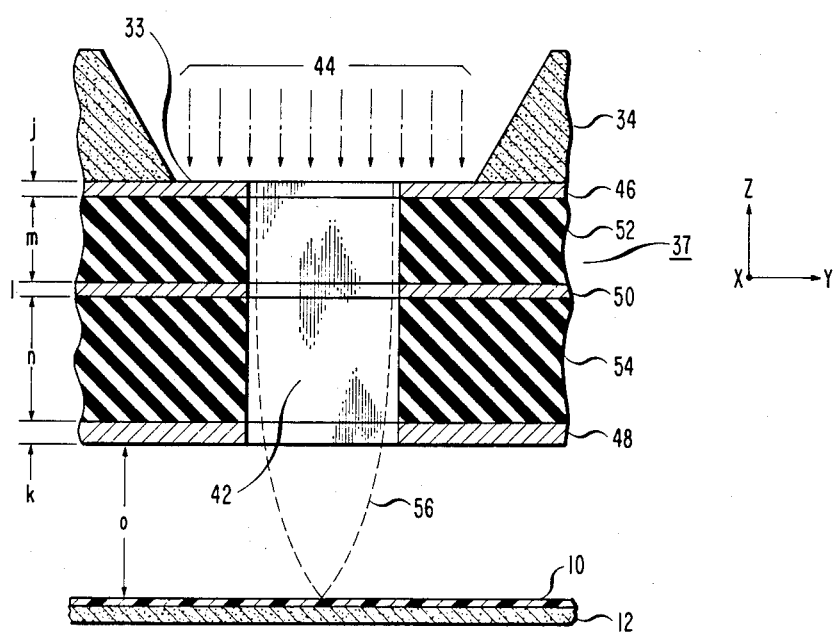
FIG. 4 is a cross-sectional enlargement of a portion of FIG. 3 as viewed in the direction of arrows 4 of FIG. 3.

FIG. 4 shows the aperture 42 of FIG. 3 formed in the subassembly 37. Electrons incident on the top surface 33 of the subassembly 37 are represented by dash lines 44. But, importantly, in practice only one electron at a time at most is present in the volume of each aperture. Hence, space-charge limits on current are thereby avoided.

The subassembly 37 shown in FIG. 4 comprises a top electrode 46 peripherally disposed around the entrance of the aperture 42, a peripherally disposed bottom electrode 48 and a peripherally disposed gating electrode 50. By way of example, the electrodes 46, 48 and 50 each comprise a conductive layer of doped polysilicon. Intermediate insulating layers 52 and 54 in the depicted subassembly 37 are made, for example, of silicon dioxide. Illustratively, the thicknesses j, k, l, m and n of the layers 46, 48, 50, 52 and 54 are approximately 0.2 μm, 2 μm, 0.4 μm, 1 μm and 6 μm, respectively.

Advantageously, the subassembly 37 of FIG. 4 is fabricated utilizing integrated-circuit fabrication techniques. In that way, it is feasible to make a highly precise structure having closely spaced-apart micron-size apertures having relatively high aspect ratios.

Each of the apertures such as the aperture 42 (FIG. 4) in the subassembly 37 is individually controlled to transmit or not transmit to the resist layer 10 that portion of the overall electron beam that enters the top of the aperture. This so-called blanking action is controlled by the gating electrode 50. Illustratively, the potential applied to the electrode 50 and to each of the other gating electrodes in the apertured assembly 24 is either −100 volts or +400 volts. In the first case (−100 volts), electrons that enter the top of the aperture 42 are prevented from propagating toward and out of the bottom thereof. In the second case (+400 volts), an electron beam is permitted to exit from the bottom of the aperture. (In alternative arrangements, pairs of gating electrodes are effective to accomplish blanking by deflecting electrons sideways.)

The potentials applied to the top and bottom electrodes 46 and 48 of the aperture 42 included in the subassembly 36 shown in FIG. 4 are, for example, approximately +400 volts and +2500 volts, respectively. The electric fields established thereby in the aperture 42 and in each of the other apertures serve to focus each nonblanked beam onto a specified plane downstream of the subassembly 37. In the particular case illustrated in FIG. 4, the electron beam represented by dash-line envelope 56 is shown being brought to a focus at the surface of the resist-coated wafer 12 which, for example, is maintained at a potential of about +2500 volts. Illustratively, the diameter of the focused beam at the surface of the wafer is approximately 0.25 μm. In that case, the separation o between the bottom of the subassembly 37 and the surface of the resist-coated wafer 12 is about 4 μm.

By selectively varying the potentials applied to the electrodes in each aperture such as the aperture 42 of FIG. 4, the location of the focal plane of the beam transmitted therethrough can also be varied. The diameter of the focused beam can also thereby be controlled. In one specific alternative embodiment, a greater separation o, for example 20 μm, is achieved.

Electrons that impinge upon and collect on the interior sidewalls of the apertures such as the aperture 42 (FIG. 4) may in time cause undesirable electric fields to be established in the apparatus. One advantageous way of avoiding such effects is to form a thin coating of a relatively high-resistivity material on selected portions of the aperture sidewalls. In turn, the coatings are electrically connected to the aforementioned electrodes 46, 48 and 50. This will provide a leakage path for electrons. Materials such as silicon nitride or boron nitride are suitable for this purpose.

In one particular illustrative embodiment of applicants' invention, approximately 38,100 apertures each of the type depicted in FIG. 4 are arranged in an X-direction linear array in the subassembly 37. Accordingly, as many as that number of electron beams can be scanned in unison along spaced-apart parallel paths in the Y direction on the surface of the resist-coated wafer 12 across the full X-direction width thereof. During such a single-pass scan, each beam associated with an aperture is blanked or not at each Y-direction address position, depending on the value of the control voltage applied to the gating electrode in each aperture.

The data processing requirements in a single-pass scanning system of the type described above are formidable. For that reason in particular, it is often advantageous to accomplish the Y-direction scanning in several less-than-full-wafer-width passes. After each such pass, the table 14 is stepped in the X direction and then another scan abutting the immediately prior one is carried out.

In one such illustrative multiple-pass system, the length of the electron-emitting element 20 is only about 1 cm. Thus, for a 15.24-cm-wide wafer, about fifteen successive abutting passes are required to expose substantially the entire wafer. In that case, the output of the 1-cm-long element 20 is focused onto the top surface 33 of the subassembly 37 (see FIG. 2) to provide an electron beam that encompasses a linear array of about 2500 apertures (assuming the same aperture-to-aperture spacing specified earlier above).

Figure 5:
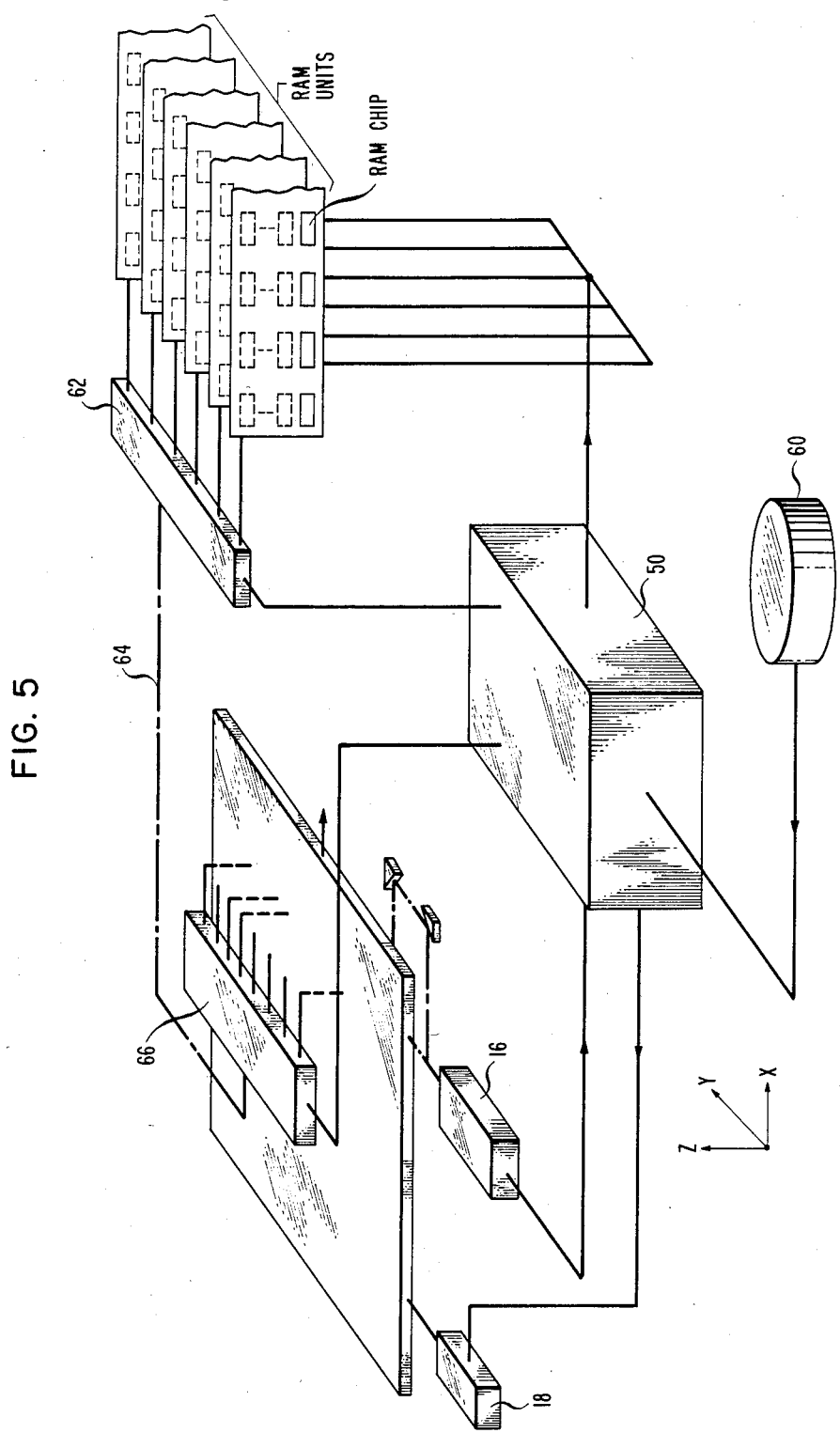
FIG. 5 is a schematic representation of an overall system including apparatus of the type illustrated in FIG. 1.

The data processing and information transfer operations of an overall lithographic system made in accordance with the principles of the present invention are schematically represented in simplified form in FIG. 5. Coordinate information representative of one level to be exposed on a resist-coated wafer is stored in a disk 60. Assuming multiple 1-cm-wide scans of the particular type mentioned above, and further assuming that repetitive 1 cm-by-1 cm pattern areas are to be exposed on the resist-coated wafer with an address structure of 0.5 μm, the disk 60 stores approximately $4 \times 10^8$ bits per level.

The information stored in the disk 60 of FIG. 5 is extracted therefrom by the computer 50 and applied to a parallel array of multiple RAM (random-access-memory) units each of which contains multiple 1-megabit RAM chips. In turn, the information transferred to the RAM units by the computer 50 is multiplexed in a standard unit 62 and then applied in serial form to a high-speed transmission line such as an optical data link 64. Advantageously, the end of the link 64 terminates directly on the assembly 24, as schematically indicated in FIG. 1. Illustratively, the assembly 24 includes a standard photodetector (not shown) coupled to the end of the link 64. In turn, the electrical output of the photodetector is applied to a conventional demultiplexer 66 (FIG. 5). Both the demultiplexer 66 and associated microminiature interconnects or leads emanating therefrom and extending to the aforementioned gating electrodes in the above-described apertures are advantageously fabricated in integrated-circuit form on portions of the silicon member 34 (FIG. 2) utilizing conventional semiconductor processing techniques. In that way, it is feasible to provide a low-cost highly integrated compact assembly including complex circuitry and thousands of individual leads.

In some cases, the relatively small spacing described above as existing between the bottom of the assembly 24 (FIG. 1) and the top of the resist-coated wafer 12 may present practical difficulties. A larger spacing may be desired to facilitate holding the wafer on the table 14 and to make it easier during lithography to perform such standard functions as alignment and focus tracking. A specific illustrative system that is characterized by such a larger spacing will be described below in connection with FIG. 6.

Additionally, the particular system specified above has been described to have only the capability to expose multiple spaced-apart regions of variable dimension in the scanning direction. In practice, it is of course also necessary to be able to selectively expose interregion portions that extend orthogonal to the scanning direction. Various ways of accomplishing this, including the particularly advantageous way illustrated in FIG. 6, will be described below.

Figure 6:
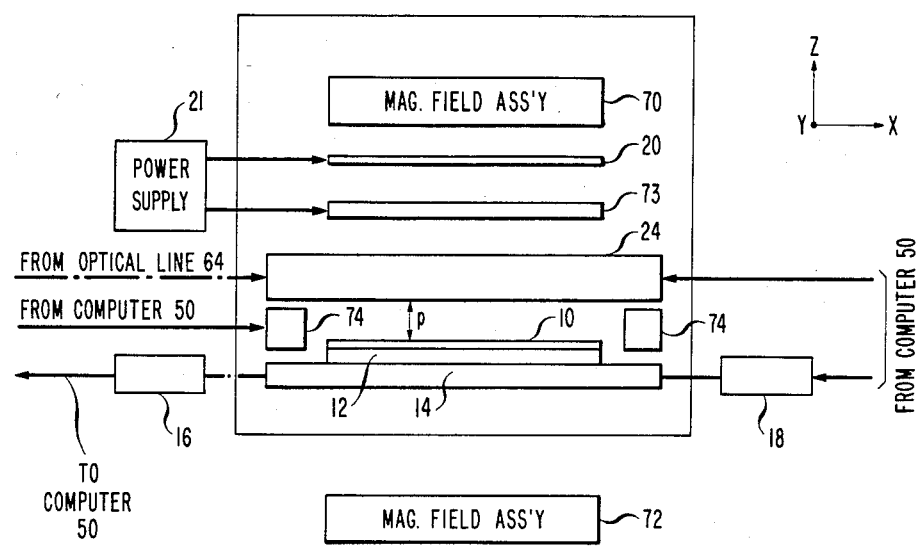
FIG. 6 shows a modified version of the FIG. 1 apparatus.

The specific illustrative system represented in FIG. 6 is a modification of the FIG. 1 system. Identical elements in the two systems are designated with the same respective reference numerals.

Additional elements in the FIG. 6 system include a magnetic field assembly 70, 72 which comprises, for example, two spaced-apart coils. When energized, these coils establish a substantially uniform magnetic field therebetween whose lines of force extend parallel to the Z direction. Alternatively, the assembly 70, 72 may comprise the respective pole pieces of an integral permanent-magnet assembly. (The table 14 may even be designed to constitute one pole piece of such a permanent-magnet assembly, if care is taken to prevent eddy currents from forming in nearby conductors.)

The purpose of the magnetic assembly 70, 72 of FIG. 6 is two-fold. First, the assembly serves to perform magnetic imaging of electrons emitted by the wire element 20. In that way, a long narrow collimated beam of electrons is imaged onto the top of the linear array of apertures included in the assembly 24. Low-voltage operation of the assembly 24 and a field-free region at the workpiece surface are characteristics of the FIG. 6 system.

Since imaging is accomplished by the magnetic field assembly 70, 72 in the space between the element 20 and the top of the assembly 24 of FIG. 6, the electrostatic lens assembly 22 shown in FIG. 1 is not needed in that space. But a conductive plate 73 having an elongated X-direction slit therethrough is shown in FIG. 6 in the element 20-to-assembly 24 space. Illustratively, the plate 73 is established at a potential of about +10,000 volts with respect to the element 20 and serves as an accelerating and beam-forming electrode in the system. Additionally, the plate 73 serves as an effective thermal shield between the hot element 20 and the assembly 24.

Importantly, the magnetic assembly 70, 72 shown in FIG. 6 also serves to project focused beams emanating from the bottom of the assembly 24 onto the surface of the resist-coated wafer 12. In other words, the assembly 70, 72 functions to transfer to the workpiece surface whatever focus is formed by the assembly 24. In practice, this allows a larger spacing between the bottom of the assembly 24 and the workpiece surface than if focusing on the surface were carried out only by the assembly 24. In one particular embodiment, the spacing p indicated in FIG. 6 is thereby permitted to be approximately 5 millimeters. In that embodiment, focused 0.5-$\mu$m-diameter beams provided by the assembly 24 are transferred onto the surface of the resist-coated workpiece in a relatively sharply focused manner because although sidewise momentum effects cause the electrostatic focus to spread, they do not so affect the magnetic focusing action.

FIG. 6 also shows an advantageous instrumentality for accomplishing X-direction movement of the beams during the main Y-direction scan. This is carried out by magnetic assembly 74 which, when energized, serves to accomplish high-speed X-direction deflection of any beam propagating downward in the space between the assembly 24 and the top of the resist-coated wafer 12. In that way, any specified portion of the regions between variable-length Y-direction scans can be selectively exposed during each main scan while the table 14 is moving.

Still other ways are available for accomplishing the aforespecified exposure in the regions between spaced-apart Y-direction scans. Thus, for example, successive interleaved Y-direction scans can be effectively employed to fill in these regions. Or, during each main Y-direction scan, high-speed mechanical movement of the table 14 by means, for example, of a piezoelectric transducer can be utilized to fill in laterally disposed regions of the surface to be exposed. Alternatively, in some cases it is feasible to purposely slightly defocus the beams emanating from the assembly 24 such that adjacent beams abut or overlap on the workpiece surface during the main Y-direction scan.

Figure 7:
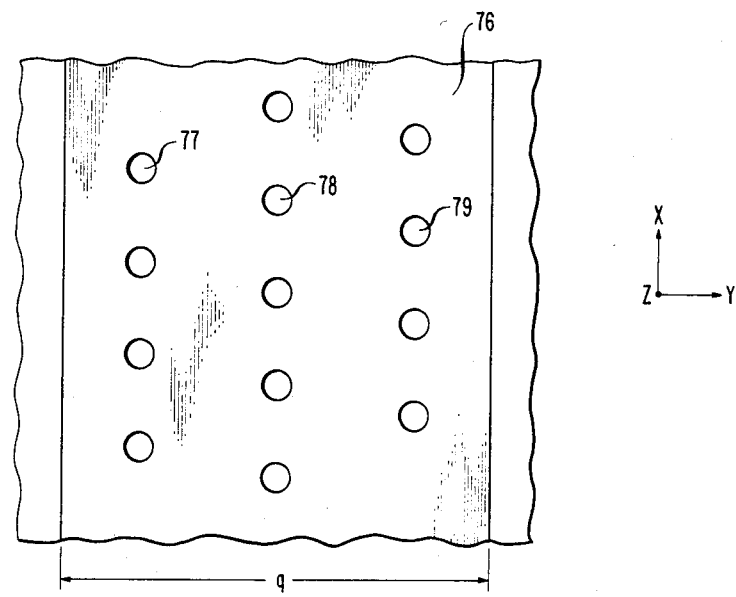
FIG. 7 depicts a two-dimensional array of beam-defining apertures suitable for inclusion in the apparatus described herein.

Yet at least another way is practicable for selectively exposing laterally disposed regions of the surface to be exposed. This way involves a modified version of the assembly 24 previously specified herein. In the modified version, a top view of which is schematically illustrated in FIG. 7, parallel rows of off-set apertures are included in an assembly 76 which is designed to replace the previously described assembly 24 shown in FIGS. 1, 2 and 3 that includes only a single elongated row of apertures. Each of the apertures in the assembly 76 also contains top and bottom electrodes and an individually controlled gating electrode, as previously described above for the assembly 24.

Illustratively, the width q of the flat top surface of the assembly 76 shown in FIG. 7 is approximately 18 $\mu$m. In practice, the entire extent of this flat surface is thus irradiated with collimated electrons emanating from the overlying X-direction-extending element 20 and defined by associated beam-forming components. By blanking or not blanking selected apertures in the assembly 76 as the underlying workpiece surface moves in the Y direction, it is thus possible to expose both Y-direction and X-direction strips on the workpiece.

More specifically, as is evident from FIG. 7, it is possible to selectively expose an X-direction strip by sequentially applying control voltages to the gating electrodes respectively included in apertures 77 through 79. Thus, for example, as a first surface region exposed by a beam that propagated through the aperture 77 reaches a point immediately above the aperture 78, the gating electrode associated with the aperture 78 can be controlled to momentarily permit the beam defined by the aperture 78 to impinge upon the workpiece surface. This causes exposure of a second X-displaced region abutting the first region. Similarly, later sequential control of the gating electrode associated with the aperture 79 can be effective to momentarily expose a third X-displaced region abutting the second region. By following such a blanking strategy over the entire array of off-set apertures, X-extending regions of the workpiece surface can be selectively exposed during each Y-direction movement of the workpiece under control of the computer 50.

In accordance with the principles of the present invention, elongated electron emitters other than the particular wire element 20 described above can be utilized in a charged-particle-beam lithographic system. Thus, for example, standard forward-biased or reverse-biased silicon diodes or triodes including p-n junctions or metal-to-semiconductor junctions are attractive substitutes for the element 20. Illustratively, a single elongated such device may be employed as a direct replacement for the element 20. Or a linear array comprising multiple such electron-emitting devices respectively aligned with apertures in the assembly is feasible. The advantage of the latter arrangement is that the devices may be individually controlled to be emitting or not. In that case, individual gating electrodes in the apertures are not required.

Figure 8:
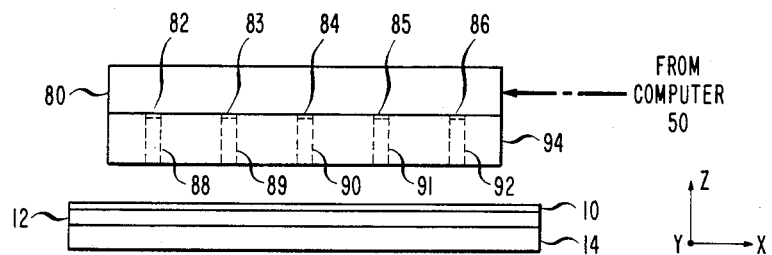
FIGS. 8 and 9 each illustrate in simplified form a modification of FIG. 1 that includes another form of charged-particle emitter.

A portion of a particularly advantageous lithographic apparatus including individual electron-emitting devices of the type specified immediately above is schematically represented in FIG. 8. As indicated there, a silicon member 80 includes individual p-n junction devices 82 through 86 positioned at the respective tops of beam-focusing apertures 88 through 92 formed in subassembly 94. Each aperture includes individual top and bottom electrodes (not shown) of the type described above in connection with FIG. 4.

The individual electron-emitting devices 82 through 86 represented in FIG. 8 are respectively controlled to be in their emitting or non-emitting states by signals applied to the devices from the aforementioned computer 50. It is advantageous to form demultiplexing circuitry and connections to the respective emitting devices in the member 80 by utilizing standard integrated-circuit fabrication techniques thereby to form a highly compact integral structure characterized by low cost and excellent reliability.

Additionally, photosensitive electron emitters may be included in lithographic apparatus made in accordance with the principles of the present invention. A specific illustrative apparatus including such photosensitive emitters is schematically represented in simplified form in FIG. 9.

Figure 9:
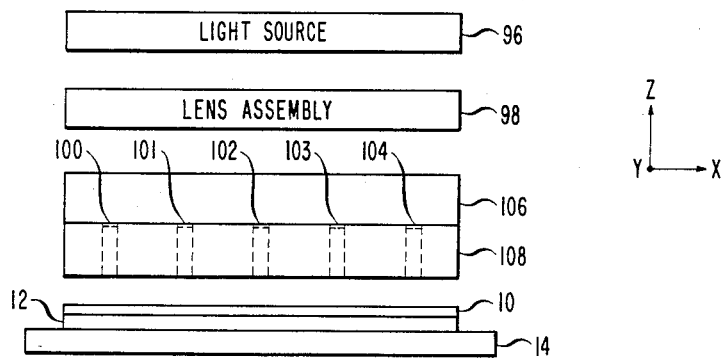

The FIG. 9 apparatus includes a light source 96 and an associated lens assembly 98. Together, these conventional elements serve to project an elongated X-direction line of light onto standard photosensitive electron emitters 100 through 104 formed on the bottom surface of a light-transparent block 106. In turn, each emitter is located at the top of a respective aperture defined in subassembly 108. By means of top, bottom and gating electrodes (not shown in FIG. 9) each electron beam emanating from an emitter is blanked or not. Also, each beam that is permitted to propagate toward the resist-coated wafer 12 is focused, in the same manner described earlier above.

Alternatively, the source 96 shown in FIG. 9 may include multiple individual light sources respectively associated with the photosensitive emitters 100 through 104. In that case, the output of each light source is focused by the assembly 98 to impinge upon its respective emitter. In some instances, it may be advantageous to individually control the multiple light sources to be ON or OFF. Or the emitters 100 through 104 may be individually electrically biased to be responsive or not to light impinging thereon. In either of these latter cases, gating electrodes are not required in the apertures in the subassembly 108.

Finally, it is to be understood that the various above-described techniques and arrangements are only illustrative of the principles of the present invention. In accordance with these principles, numerous modifications and variations may be devised by those skilled in the art without departing from the spirit and scope of the invention. For example, although the entire emphasis hereinabove has been directed to apparatus in which the multiple beams remain stationary relative to an X-Y-movable table, it is practicable to maintain the table stationary and to move the entire beam-forming assembly relative thereto. This is feasible and even in some cases attractive because in practice a beam-forming assembly made in accordance with applicants' inventive principles is relatively small and light and easily controlled to move in a reliable high-speed manner. Additionally, in some cases of practical importance, particularly in embodiments of the type illustrated in FIGS. 8 and 9, the entire particle-emitting apparatus need not be included within a vacuum chamber. Thus, for example, standard differential pumping techniques may be employed to selectively establish the required vacuum conditions only in the immediate vicinity of those portions of the space between the apertured assembly and the workpiece surface where particles propagate between the assembly and the workpiece surface. Further, selective deflection of an elongated X-direction line of light may be advantageously applied to apparatus that includes rows of apertures each including photosensitive emitters.

What is claimed is:

1. Charged-particle-beam apparatus adapted to selectively expose the surface of a workpiece, said apparatus comprising elongated particle-emitting means comprising multiple spaced-apart particle-emitting elements approximately centered relative to and adapted to emit particles along multiple respective parallel longitudinal axes of said apparatus, means including an elongated apertured array responsive to charged particles for forming multiple parallel beams directed at said workpiece surface, each aperture of said array being associated with a respective one of said particle-emitting elements and being approximately centered relative to the longitudinal axis of said associated particle-emitting element, and means for establishing a substantially uniform magnetic field in the entirety of the space between the bottom of said apertured array and the surface of said workpiece in a direction perpendicular to said workpiece surface and parallel to said longitudinal axes for simultaneously controlling beams emanating from said apertures to propagate approximately along the respective longitudinal axes of said apertures during the entire extent of their propagation in said space and to be focused on the surface of said workpiece in approximate longitudinal alignment with the respective apertures from which the beams emanated.

2. Apparatus as in claim 1 further including means for individually blanking said beams.

3. Apparatus as in claim 2 further including means for scanning said beams in unison across said workpiece surface in a specified direction.

4. Apparatus as in claim 3 wherein said workpiece surface comprises the surface of a resist-coated semiconductor wafer.

5. Apparatus as in claim 4 wherein said scanning means comprises
means for supporting said workpiece,
and means for moving said supporting means in said specified direction.

6. Apparatus as in claim 3 where said elongated array includes
at least one row of spaced-apart apertures disposed in the path of particles from said elongated means to permit particles that pass through said apertures to impinge upon said workpiece surface, said row(s) being orthogonal to said specified direction.

7. Apparatus as in claim 6 wherein said elongated particle-emitting means is spaced apart from the entrances of said apertures.

8. Apparatus as in claim 7 further including
means for focusing particles from said elongated particle-emitting means and directing said particles into the entrances of said apertures.

9. Apparatus as in claim 8 further including
means associated with each aperture for electrostatically focusing particles propagated therethrough.

10. Apparatus as in claim 9 further including
means associated with each aperture for controlling whether or not particles directed therein propagate to the respective exits thereof.

11. Apparatus as in claim 10 wherein said elongated particle-emitting means comprises
a wire element,
and means for heating said element to cause electrons to be emitted therefrom.

12. Apparatus as in claim 12 wherein said focusing and directing means comprises
said aforecited means for establishing a substantially uniform magnetic field, which means is also adapted to establish magnetic field lines in the space between said element and the top of said elongated apertured array in a direction perpendicular to the top of said array.

13. Apparatus as in claim 12 wherein said focusing and directing means further comprises
accelerating electrode means in the space between said element and the top of said elongated apertured array.

14. Apparatus as in claim 13 wherein said electrode means includes an elongated slit that is approximately coextensive with the length of said wire element.

15. Apparatus as in claim 6 further including
means for causing said beams to impinge upon selected surface portions of said workpiece between the regions scanned by the beams in said specified scanning direction.

16. Apparatus as in claim 15 wherein said impinging means comprises
means for periodically establishing magnetic lines of force parallel to the surface of said workpiece in a direction orthogonal to said specified scanning direction to cause beams emanating from said apertures to be deflected to said selected surface portions.

17. Apparatus as in claim 15 wherein said impinging means comprises
multiple offset rows of apertures in said elongated array in the path of particles from said elongated particle-emitting means, the amount of offset from row to row being such that all surface portions of said workpiece can be impinged upon as scanning takes place in the specified direction,
and means for individually controlling whether or not particles directed into said apertures emanate therefrom to impinge upon said workpiece surface.

18. Apparatus as in claim 6 wherein said particle-emitting means comprises
a single elongated junction,
and means for biasing said junction to emit particles.

19. Apparatus as in claim 6 wherein said particle-emitting means comprises
multiple individual junctions respectively positioned at the entrances of said apertures,
and means for individually biasing said junctions to emit particles or not.

20. Apparatus as in claim 6 wherein said particle-emitting means comprises
multiple individual photosensitive elements respectively positioned at the entrances of said apertures,
and means for individually controlling said elements to emit particles or not.

21. Apparatus as in claim 6 wherein said elongated array includes demultiplexing circuitry and interconnection circuitry formed thereon to form a unitary integrated-circuit assembly,
and data processing means including a high-speed data link connected to said demultiplexing circuitry to provide blanking signals via said interconnection circuitry to said respective apertures.

22. A method of making microminiature devices by directly writing on a workpiece surface with a charged-particle beam, said method comprising the steps of
directing charged particles at an elongated array from a particle emitter that is at least coextensive with said array to form multiple parallel beams each being approximately centered relative to a respective longitudinal axis,
individually blanking said beams,
by means of a uniform magnetic field in the entirety of the space between the bottom of said array and the surface of said workpiece, projecting said parallel beams from said array to said workpiece surface substantially along respective longitudinal axes that are parallel to each other,
said beams being propagated along said respective parallel longitudinal axes during the entire extent of their propagation in said space,
and scanning said beams in unison across said workpiece surface in a specified direction.

23. A method as in claim 22 further including the step of
causing said beams to impinge upon selected surface portions of said workpiece between the regions scanned by the beams in said specified scanning direction.

* * * * *